United States Patent [19]
Veenstra

[11] Patent Number: 5,486,775
[45] Date of Patent: Jan. 23, 1996

[54] MULTIPLEXER STRUCTURES FOR USE IN MAKING CONTROLLABLE INTERCONNECTIONS IN INTEGRATED CIRCUITS.

[75] Inventor: Kerry Veenstra, San Jose, Calif.

[73] Assignee: Altera Corporation, San Jose, Calif.

[21] Appl. No.: 156,260

[22] Filed: Nov. 22, 1993

[51] Int. Cl.[6] .............................................. H03K 19/177
[52] U.S. Cl. .................................................. 126/38; 326/41
[58] Field of Search .......................... 340/825.83, 825.79, 340/825.87; 370/112; 326/38, 39, 86, 90, 97, 114, 119, 41

[56] References Cited

U.S. PATENT DOCUMENTS

| | | | |
|---|---|---|---|
| 4,870,304 | 9/1989 | Blocker et al. | 307/468 |
| 4,899,067 | 2/1990 | So et al. | 307/465 |
| 4,933,575 | 6/1990 | Aso | 307/465 |
| 4,965,474 | 10/1990 | Childers et al. | 307/542 |
| 5,095,523 | 3/1992 | Delaryelle et al. | 395/800 |
| 5,225,719 | 7/1993 | Agrawal et al. | 307/465 |
| 5,241,224 | 8/1993 | Pederson et al. | 307/465 |

OTHER PUBLICATIONS

P. K. Wong, "Cages—A Survey," Journal of Graph Theory, vol. 6, No. 1, 1982, pp. 1–22.

Primary Examiner—Wellington Chin
Assistant Examiner—Ajit Patel
Attorney, Agent, or Firm—Fish & Neave; Robert R. Jackson; G. Victor Treyz

[57] ABSTRACT

Communication networks for integrated circuits such as programmable logic devices have a plurality of input conductors each of which is connected to two output multiplexers. For good signal routability through the network, no two multiplexers are connected to the same two input conductors. The girth of the multiplexer allocation graph associated with the network is four, and the graph is preferably a highly regular structure known as a cage or a regular structure derived from a cage. The input conductors are assigned to the edges in this regular graph in such a way that a highly regular pattern of connections between the input conductors and the multiplexers results to facilitate physical implementation of the network in the integrated circuit.

9 Claims, 8 Drawing Sheets

FIG.12
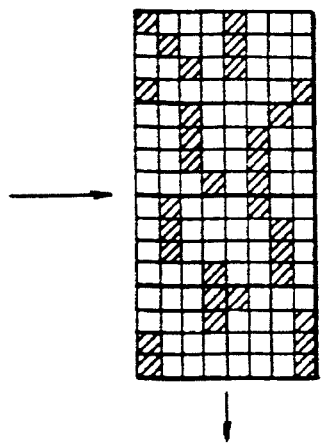
FIG.13
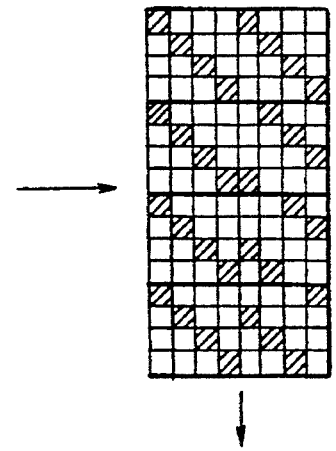
FIG.14
| 0 | 10 | 20 | 30 | 40 | 50 | 60 | 70 | 80 | 90 | → MUX 0 |
|---|---|---|---|---|---|---|---|---|---|---|
| 91 | 1 | 11 | 21 | 31 | 41 | 51 | 61 | 71 | 81 | → MUX 1 |
| 82 | 92 | 2 | 12 | 22 | 32 | 42 | 52 | 62 | 72 | → MUX 2 |
| 73 | 83 | 93 | 3 | 13 | 23 | 33 | 43 | 53 | 63 | → MUX 3 |
| 64 | 74 | 84 | 94 | 4 | 14 | 24 | 34 | 44 | 54 | → MUX 4 |
| 55 | 65 | 75 | 85 | 95 | 5 | 15 | 25 | 35 | 45 | → MUX 5 |
| 46 | 56 | 66 | 76 | 86 | 96 | 6 | 16 | 26 | 36 | → MUX 6 |
| 37 | 47 | 57 | 67 | 77 | 87 | 97 | 7 | 17 | 27 | → MUX 7 |
| 28 | 38 | 48 | 58 | 68 | 78 | 88 | 98 | 8 | 18 | → MUX 8 |
| 19 | 29 | 39 | 49 | 59 | 69 | 79 | 89 | 99 | 9 | → MUX 9 |
| ↓ MUX 10 | ↓ MUX 11 | ↓ MUX 12 | ↓ MUX 13 | ↓ MUX 14 | ↓ MUX 15 | ↓ MUX 16 | ↓ MUX 17 | ↓ MUX 18 | ↓ MUX 19 | |

MULTIPLEXER STRUCTURES FOR USE IN MAKING CONTROLLABLE INTERCONNECTIONS IN INTEGRATED CIRCUITS.

BACKGROUND OF THE INVENTION

This invention relates to multiplexer-type structures for use in making controllable interconnections in integrated circuits such as programmable logic devices.

Pedersen et al. U.S. Pat. No. 5,241,224 teaches that instead of a large cross-point type switch capable of connecting any input to the switch to any output from the switch in order to route signals through an integrated circuit such as a programmable logic device, a more economical arrangement of multiplexers can often be used to provide a sufficient subset of such signal routing capability. In a programmable logic device, for example, other programmable circuitry associated with the communication network selects which of the multiplexer inputs is actually enabled when the device is used. The objective of the '224 patent is to provide enough interconnection capability so that the signal routing required in most applications of the circuit can be accomplished without unduly burdening the circuit with large amounts of interconnection capability that will be unused in a large number of cases. To accomplish this objective the '224 patent teaches connecting each input signal conductor to two different multiplexers, and avoiding connection of any two input conductors to the same two multiplexers. The '224 patent also teaches that the input conductors and the multiplexers they feed should preferably form an acyclic chain.

Although the multiplexer connection arrangements taught in the '224 patent have been highly successful, it has been found that those arrangements may have one or more disadvantages in some situations. For example, the '224 patent multiplexer connection arrangements are relatively complicated to select and implement. In other words, it may be relatively difficult to design a multiplexer connection arrangement that satisfies the '224 patent criteria. And because the '224 patent criteria tend to produce multiplexer connection arrangements that are highly irregular or random, substantial effort may be required to physically implement them in the integrated circuit. There is little or no repetition in the '224 patent multiplexer connection arrangements that can be relied on to help speed the detailed circuit design process. All of these factors tend to increase the manufacturing cost of the integrated circuit.

Another possible disadvantage of the '224 patent multiplexer connection arrangements is that they may call for connection of two or more adjacent input conductors to the same multiplexer. This may further complicate the task of physically implementing the circuit, and it may even prevent placing the input conductors as close together as would otherwise be possible and desirable in order to make the most efficient use of the area of the integrated circuit.

In view of the foregoing, it is an object of this invention to provide improved multiplexer-based interconnection structures or communication networks for use in integrated circuits such as programmable logic devices.

It is a more particular object of this invention to provide integrated circuit interconnection structures or communication networks which make use of multiplexers and which have most or all of the advantages of the '224 patent arrangements without any of the above-mentioned possible disadvantages of the '224 patent arrangements.

SUMMARY OF THE INVENTION

These and other objects of the invention are accomplished in accordance with the principles of the invention by providing multiplexer-based communication networks for integrated circuits which are characterized by multiplexer allocation graphs having a girth parameter of four and a regular structure which repeats as the size of the graph increases. Such graphs (known as "cages" of girth four) are used to provide a straightforward basis for designing a communication network of any size. The design task does not become significantly more complex as the size of the communication network increases. The arrangement of connections between the input signal conductors and inputs to the multiplexers can be derived from the cage in a simple and straightforward manner. Moreover, that arrangement of connections can be quite regular, if desired, to facilitate the process of physically implementing the connections in the integrated circuit. The arrangement of connections can also be readily made to avoid having to connect two or more adjacent input signal conductors to the same multiplexer input. This also facilitates the physical implementation task, and it may make it possible to place the input signal conductors closer to one another.

Further features of the invention, its nature and various advantages will be more apparent from the accompanying drawings and the following detailed description of the preferred embodiments.

BRIEF DESCRIPTION OF THE DRAWINGS

FIG. 12 is a diagram of a typical multiplexer connection pattern that is relatively undesirable from the standpoint of this invention.

FIG. 13 is a diagram of a typical multiplexer connection pattern that results from the practice of this invention.

FIG. 14 is an illustrative diagram of the type that can be used in accordance with this invention to help make assignments of input conductors to multiplexers so as to produce desirable multiplexer connection patterns of the type shown in FIG. 13.

DETAILED DESCRIPTION OF THE PREFERRED EMBODIMENTS

Figure 1:
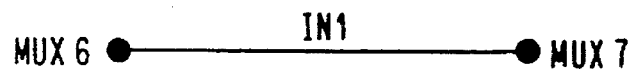
FIG. 1 is an elementary diagram of the type known as a multiplexer allocation graph that is useful in explaining the principles of such graphs.
Figure 2:
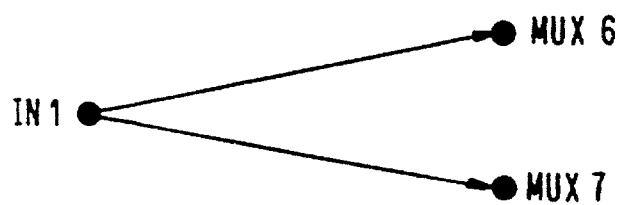
FIG. 2 is a more conventional circuit diagram of the circuitry represented by FIG. 1.

In communication networks that conform to the requirements taught in the '224 patent, each input to the network drives a unique pair of output multiplexers. As shown in FIG. 1, for example, if network input IN1 drives network outputs MUX6 and MUX7, then no other network input will drive both MUX6 and MUX7. (FIG. 1 is a type of diagram referred to herein as a multiplexer allocation graph. FIG. 2 is a more conventional circuit diagram of the communication network represented by FIG. 1. In a multiplexer allocation graph such as FIG. 1, the vertices represent multiplexers and the edges represent communication network inputs.)

Figure 3:
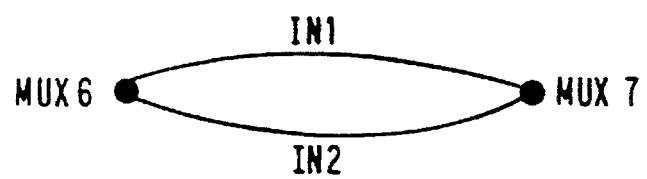
FIG. 3 is another elementary multiplexer allocation graph.
Figure 4:
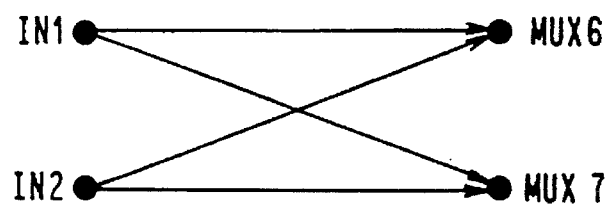
FIG. 4 is a more conventional circuit diagram of the circuitry represented by FIG. 3.

Networks with multiple inputs driving the same pair of outputs are detected by "parallel" edges in the associated multiplexer allocation graph. FIG. 3 shows such a multiplexer allocation graph for two network inputs IN1 and IN2 and two multiplexers MUX6 and MUX7. FIG. 4 is the more conventional circuit diagram depiction of the communication network represented by FIG. 3. One of the objectives of the '224 patent is to avoid communication networks characterized by multiplexer allocation graphs with "parallel" edges of the type illustrated by FIG. 3.

Figure 5:
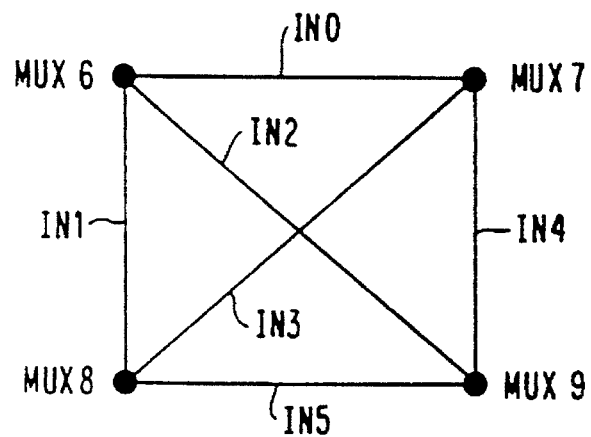
FIG. 5 is still another elementary multiplexer allocation graph.
Figure 6:
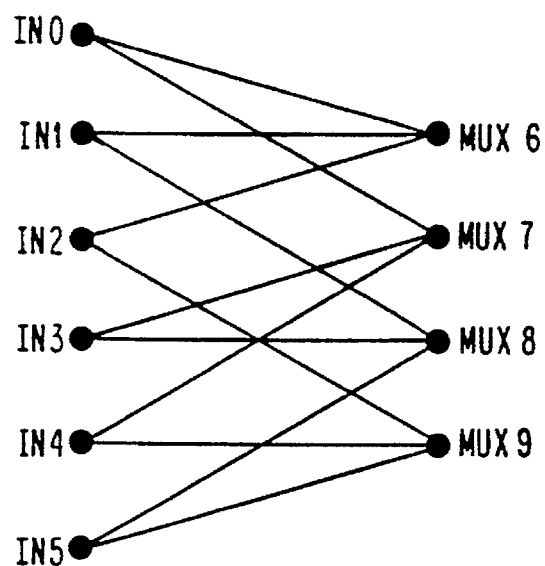
FIG. 6 is a more conventional circuit diagram of the circuitry represented by FIG. 5.

In order to avoid "parallel" edges in a multiplexer allocation graph, the graph must have a "girth" of three or more. The girth of a multiplexer allocation graph is the number of edges in its shortest cycle. FIG. 5 shows a multiplexer allocation graph having a girth of three. (FIG. 6 is the more conventional circuit diagram depiction of the communication network represented by FIG. 5.) The graph of FIG. 5 has a girth of three because, starting at any vertex, the minimum number of edges of the graph that must be traversed in order to return to that vertex is three. For example, starting at vertex MUX9, there is no path through the graph and back to MUX9 which does not involve at least three edges of the graph. (The path IN4, IN3, and IN5 is an example of one such path.)

The multiplexer allocation graph of the typical communication network which results from use of the '224 patent criteria for network design is three. In effect, although the '224 patent does not specifically mention multiplexer allocation graphs, the '224 patent teaches that "routability" through a multiplexer-type communication network is improved by increasing the girth of the associated multiplexer allocation graph from two (as in FIG. 3) to three. (Routability refers to the ability of the communication network to effect a wide variety of different connection patterns without required connections being blocked.)

Figure 7:
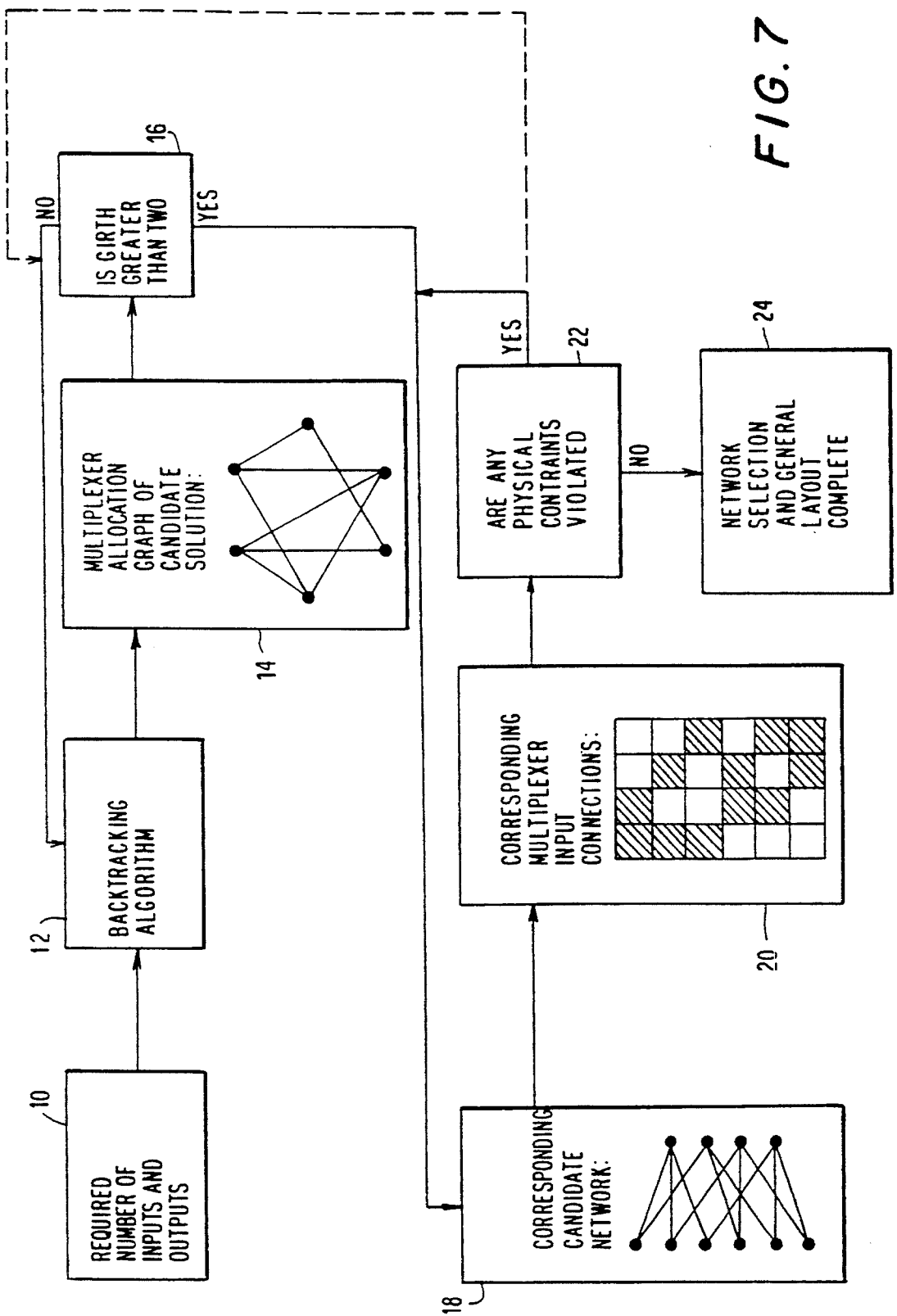
FIG. 7 is a flow chart depicting a prior technique for devising a multiplexer connection pattern for multiplexer-based networks.

The typical technique for designing communication networks in accordance with the '224 patent criteria is shown in FIG. 7. This technique starts in step 10 with the network's required dimensions (i.e., the number of inputs and the number of outputs). A backtracking algorithm (step 12) is then used to search for conforming solutions. The multiplexer allocation graph of a candidate solution is constructed in step 14 and tested in step 16 to make sure that its girth is greater than two. If not, steps 12, 14, and 16 are repeated until a candidate solution which passes the test of step 16 is found.

After successful completion of step 16, step 18 is performed to select a candidate network which corresponds to the multiplexer allocation graph from the preceding steps. (By changing the network inputs associated with the edges of the multiplexer allocation graph and/or by changing the multiplexers associated with the vertices of that graph, many different candidate networks can typically be derived from one multiplexer allocation graph.)

In step 20 the multiplexer input connections associated with the network from step 18 are determined. (As described more fully below, multiplexer connection patterns like the one shown in step 20 indicate by shaded squares connections between input conductors (each represented by a horizontal row of squares) and multiplexers (each represented by a vertical column of squares).) In step 22 the multiplexer input connection pattern from step 20 is tested to see if it will violate any physical constraints if implemented in the integrated circuit. If such physical constraints will be violated, steps 18 through 22 are repeated until a solution which does not violate any physical constraints is found and the process is therefore complete as indicated in step 24. As indicated by the dotted line in FIG. 7 it may be necessary to go all the way back to step 12 if repeating only steps 18 through 22 does not eventually lead to step 24.

As FIG. 7 and the foregoing discussion demonstrate, the process of designing a communication network as taught by the '224 patent can be a protracted, trial-and-error procedure. Moreover, the multiplexer input connection patterns that result tend to appear random or nearly random (see, for example, the typical pattern shown in step 20). As noted in the introductory sections of this specification, such random or nearly random patterns may be less efficient to manufacture than more regular patterns such as are shown in FIGS. 13, 15, and 17–20 and discussed below.

The present invention aims to further improve routability through a multiplexer-type communication network by increasing the girth of the associated multiplexer allocation graph from three to four. One could search for graphs of girth four using the same technique as is shown in FIG. 7. However, that would merely perpetuate the disadvantages of the backtracking technique (namely, a protracted trial-and-error procedure resulting in random multiplexer input connection patterns that are relatively inefficient to manufacture).

In accordance with the preferred embodiments of this invention a more direct approach is taken to producing communication networks characterized by multiplexer allocation graphs of girth four. This more direct approach employs graphs called "cages". Cages are graphs with a specified girth, all of whose vertices have a specified "degree" or "valency", and that are known to have the fewest number of vertices possible, while still satisfying the girth and degree requirements. In accordance with the preferred embodiments of this invention cages of girth four are used as multiplexer allocation graphs for the communication networks produced.

Figure 8:
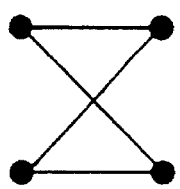
FIGS. 8–10 are representative regular multiplexer allocation graphs or cages of the type that are employed in accordance with this invention.
Figure 9:
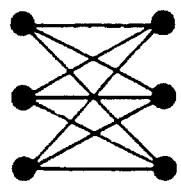
Figure 10:
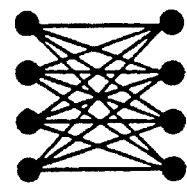
Figure 11:
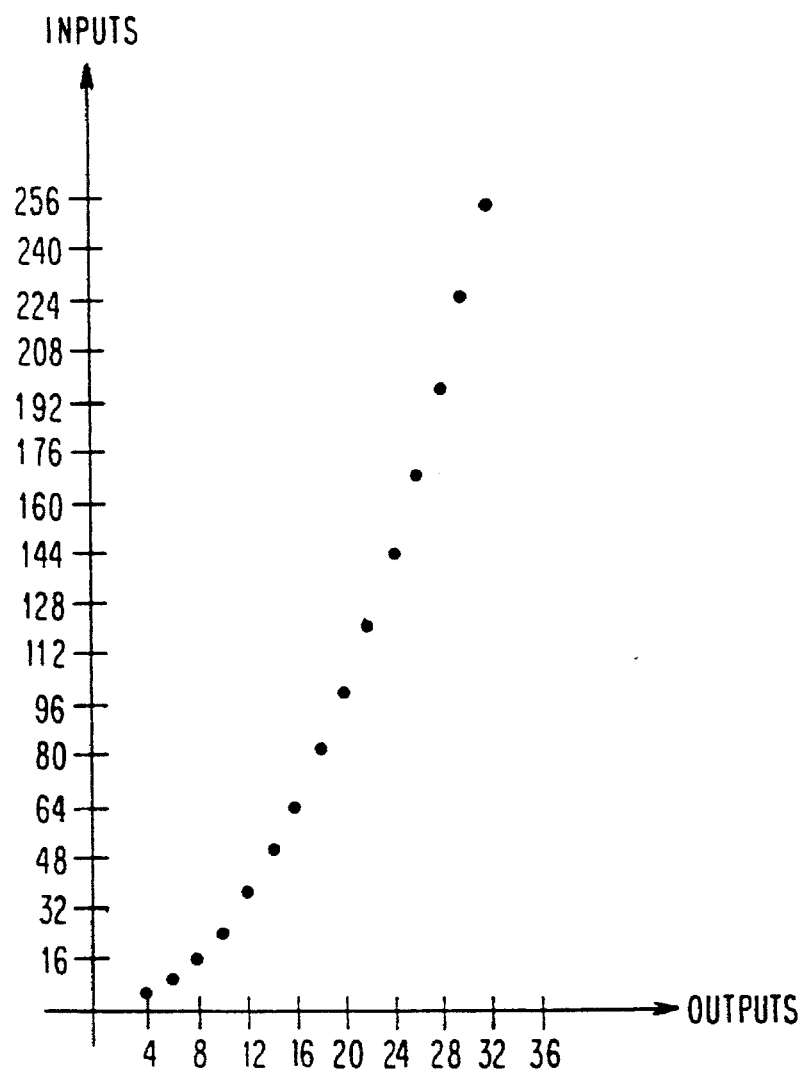
FIG. 11 is a plot showing the dimensions of several sizes of multiplexer allocation cages of the type that are employed in accordance with this invention.

The first three cages of girth four are shown in FIGS. 8–10. The degree of the cage in FIG. 8 is two. The degree of the cage in FIG. 9 is three. And the degree of the cage in FIG. 10 is four. It will be noted that the pattern shown in FIG. 8 repeats and multiplies in the cages of higher degree, and that it is a relatively simple matter to construct the higher degree cages from the basic pattern of FIG. 8. In general, if v is the degree or valency of a cage of girth four, it is known that the number of vertices of that cage is 2v and the number of edges of that cage is $v^2$. Because edges in multiplexer allocation graphs correspond to network inputs, while vertices correspond to network outputs, communication networks synthesized from multiplexer allocation graphs which are cages having girth four and degree v have $v^2$ inputs and 2v outputs. The dimensions of the first 15 such networks are shown in Table 1 below and are plotted in FIG. 11.

TABLE 1

| Inputs | Outputs | Multiplexer Size |
|--------|---------|------------------|
| 4      | 4       | 2 to 1           |
| 9      | 6       | 3 to 1           |
| 16     | 8       | 4 to 1           |
| 25     | 10      | 5 to 1           |
| 36     | 12      | 6 to 1           |
| 49     | 14      | 7 to 1           |
| 64     | 16      | 8 to 1           |
| 81     | 18      | 9 to 1           |
| 100    | 20      | 10 to 1          |
| 121    | 22      | 11 to 1          |
| 144    | 24      | 12 to 1          |
| 169    | 26      | 13 to 1          |
| 196    | 28      | 14 to 1          |
| 225    | 30      | 15 to 1          |
| 256    | 32      | 16 to 1          |
| $v^2$  | 2v      | v to 1           |

It will be apparent from the foregoing that using cages of girth four is a very direct way of finding a multiplexer allocation graph of girth four having approximately any number of inputs (e.g., four, nine, 16, 25, etc., inputs). Moreover, this technique always produces highly regular multiplexer allocation graphs such as are shown in FIGS. 8–10 and straightforward extrapolations thereof. The trial-and-error process and the typically highly irregular multiplexer allocation graphs of the '224 patent are therefore avoided.

It will be noted from FIGS. 8–10 that in all cages of girth four the vertices can be divided into two mutually exclusive sets or groups of equal size. Each vertex in each group has a direct connection via an edge to every vertex in the other group, but no direct connection via an edge to any other vertex in the same group. In each of FIGS. 8–10 one of the above-mentioned groups of vertices is on the left, while the other group is on the right.

The next step in the production of a communication network in accordance with this invention is to determine how the circuitry represented by the multiplexer allocation graph is to be implemented in the integrated circuit. The network inputs are usually routed to adjacent parallel "wires" in the circuit, while the multiplexers for the network's outputs are constructed from perpendicular columns of circuitry, each of which connects to the necessary input wires. The two-dimensional pattern of connections between the input wires and the multiplexer circuitry may be referred to as the "multiplexer pattern". For convenience such patterns are represented herein as shown in step 20 in FIG. 7. The particular pattern shown there has six input "wires" extending parallel to one another in the horizontal direction, and four multiplexers respectively represented by the four vertical columns. A shaded square represents a connection between the input wire (row) and the multiplexer (column) that intersect at that square. An unshaded square represents no connection between the input wire (row) and multiplexer (column) intersecting at that square. Although the input wires are thus always shown herein as extending horizontally, while the multiplexers are shown extending vertically, it will be understood that these components can have any orientation (usually perpendicular to one another) on the integrated circuit.

There is a strong relationship between a multiplexer pattern and the physical network that it represents. Individual shaded squares in the pattern usually correspond to vias on contacts between layers of a chip, although it is not uncommon for a single connection in a multiplexer pattern to control several layers of a tightly drawn design. Unseen in an abstract multiplexer pattern are constraints between layers which, if violated, would make the network unmanufacturable.

It can be helpful for the inputs of each multiplexer to be "spread out" (vertically in the multiplexer pattern diagrams shown herein) to provide predictable area for the multiplexer circuitry. The illustrative multiplexer pattern shown in FIG. 12 (16 input conductors and eight output multiplexers) is relatively poor in this respect. For example, the rightmost multiplexer in FIG. 12 is connected to the bottom three inputs. The close proximity of these input lines lead to layout inefficiencies, or those inefficiencies may preclude the input lines from being located as close to one another as would otherwise be most efficient and economical. In the better multiplexer pattern shown in FIG. 13 the four inputs to each multiplexer are spread out among each of the four quarters of the input lines, thereby ensuring uniform area for each multiplexer's layout.

A technique which can be used to derive "good" multiplexer patterns of the type illustrated by FIG. 13 is demonstrated in FIG. 14. The $v^2$ cells in FIG. 14 represent the network inputs. The v rows and v columns in FIG. 14 represent the network's 2v outputs. Because each cell is a member of exactly one row and one column, each input of the network is connected to exactly two multiplexers. In the particular example shown in FIG. 14 v is 10, so the network has 100 input conductors (numbered 0 through 99) and 20 multiplexers (numbered MUX0 through MUX19). The fourth group of 10 network inputs is partly shaded to show how the input conductors in each group feed all of the multiplexers exactly once. (Note that the rows in FIG. 14 are all associated with one of two mutually exclusive groups of cage vertices between which there are no direct edge connections, while the columns in FIG. 14 are all associated with the other of these two groups of cage vertices. Note also that it facilitates spreading the multiplexer connections horizontally in patterns of the type shown in FIG. 13 to separate the multiplexers associated with these two groups of vertices into two separate groups on the integrated circuit.)

A two-dimensional table of the type shown in FIG. 14 is actually a representation of the correspondingly sized multiplexer allocation graph which is a cage of girth 4. A table of the type shown in FIG. 14 is prepared by subdividing the $v^2$ input conductors into v groups, each group including v adjacent input conductors. Each group of inputs is then arrayed in order along a respective "diagonal" of the two-dimensional table. A "diagonal" of the table may be either continuous (as in the case of the diagonal from input 0 to input 9 in FIG. 14) or two discontinuous segments (as in the case of the segment from input 30 to input 36 together with the segment from input 37 to input 39 in FIG. 14). The result of this procedure is to spread out the inputs of each multiplexer so that each multiplexer has one input per band with no vertically adjacent multiplexer inputs in the final multiplexer pattern. In particular, in progressing from one input conductor group to the next adjacent input conductor group, the input conductors from each group that are adjacent to one another are selected so that neither multiplexer fed by either input conductor is one of the multiplexers fed by the other input conductor. This is the same as saying that in the associated multiplexer allocation cage the edges associated with these two input conductors do not have a vertex in common. The vertical spreading of the multiplexer input connections which results from the foregoing ensures room for all of the multiplexer transistors in the integrated circuit.

Figure 15:
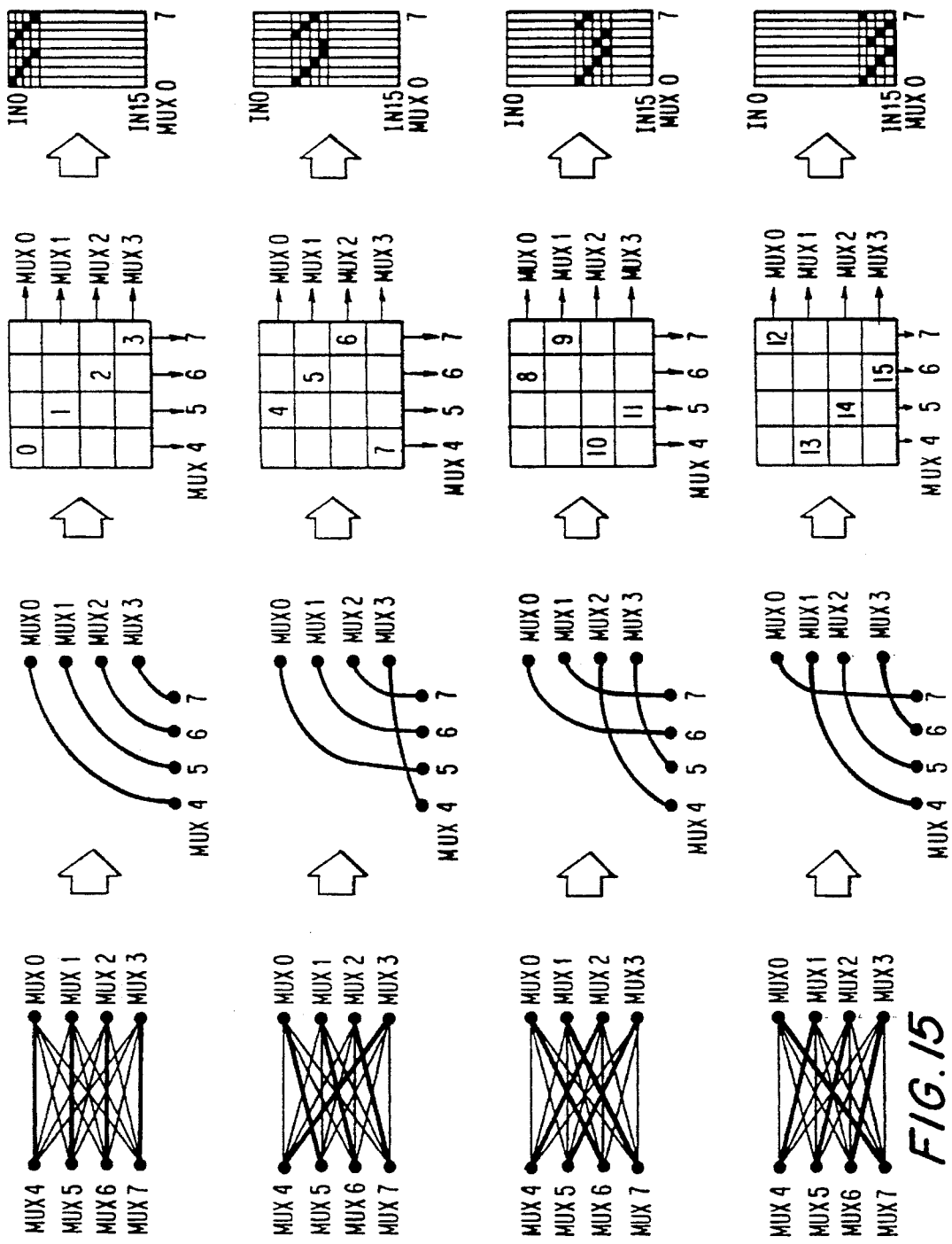
FIG. 15 is a diagram illustrating the entire process in accordance with this invention of producing a representative multiplexer input connection pattern from a multiplexer allocation cage of the preferred type.

Another way to look at the foregoing procedure comes from the theory of cages of girth four. It is known from that theory that the edges in any such cage of degree v can be colored with v colors, no two edges of the same color having any vertex in common. For convenience herein all edges of a given color in such a consideration of a cage of girth four are referred to as a "band" of edges. Each group of input conductors in the foregoing discussion therefore corresponds to the edges of a given color or the edges in a given band. FIG. 15 illustrates the entire process (for a cage of girth four and degree four) from the starting multiplexer allocation cage through the resulting multiplexer pattern. On the left FIG. 15 shows by means of heavy or emphasized edges how the multiplexer allocation graph can be colored using four colors to divide the 16 edges in the graph into four bands of four edges each. To the right of the "colored" graphs, FIG. 15 shows a redrawing of only the edges in each band, with the vertices of the graphs relocated to correspond to the locations of the multiplexers along two perpendicular edges of the two-dimensional tables shown to the right of the redrawn graphs. In the two-dimensional tables the numbers of the input conductors are arrayed along diagonals on a band-by-band basis. And on the extreme right in FIG. 15 the resulting multiplexer pattern is shown for each band. The composite of these multiplexer patterns is shown in FIG. 13. As pointed out above, the FIG. 13 multiplexer pattern has the desirable feature that there are no connections to any multiplexer that are immediately adjacent to one another. The multiplexer patterns of this invention are also much more regular than the apparently random patterns that are typical of the prior art as illustrated, for example, by FIG. 12.

It will be apparent from the foregoing, and especially FIG. 13, that if it is desired to produce a network having 2v outputs but fewer than $v^2$ inputs, one can simply delete inputs from the top or bottom of the multiplexer pattern with no adverse effect on the advantageous features of the pattern. Alternatively or in addition, one can delete any number of whole bands from the pattern with no adverse effect. Table 2 below shows what sizes of networks result when whole numbers of multiplexer allocation bands are deleted from a network generated for v=12.

TABLE 2

| Inputs | Outputs | Multiplexer Size |
|--------|---------|------------------|
| 24 | 24 | 2 to 1 |
| 36 | 24 | 3 to 1 |
| 48 | 24 | 4 to 1 |
| 60 | 24 | 5 to 1 |
| 72 | 24 | 6 to 1 |
| 84 | 24 | 7 to 1 |
| 96 | 24 | 8 to 1 |
| 108 | 24 | 9 to 1 |
| 120 | 24 | 10 to 1 |
| 132 | 24 | 11 to 1 |
| 144 | 24 | 12 to 1 |

Figure 16:
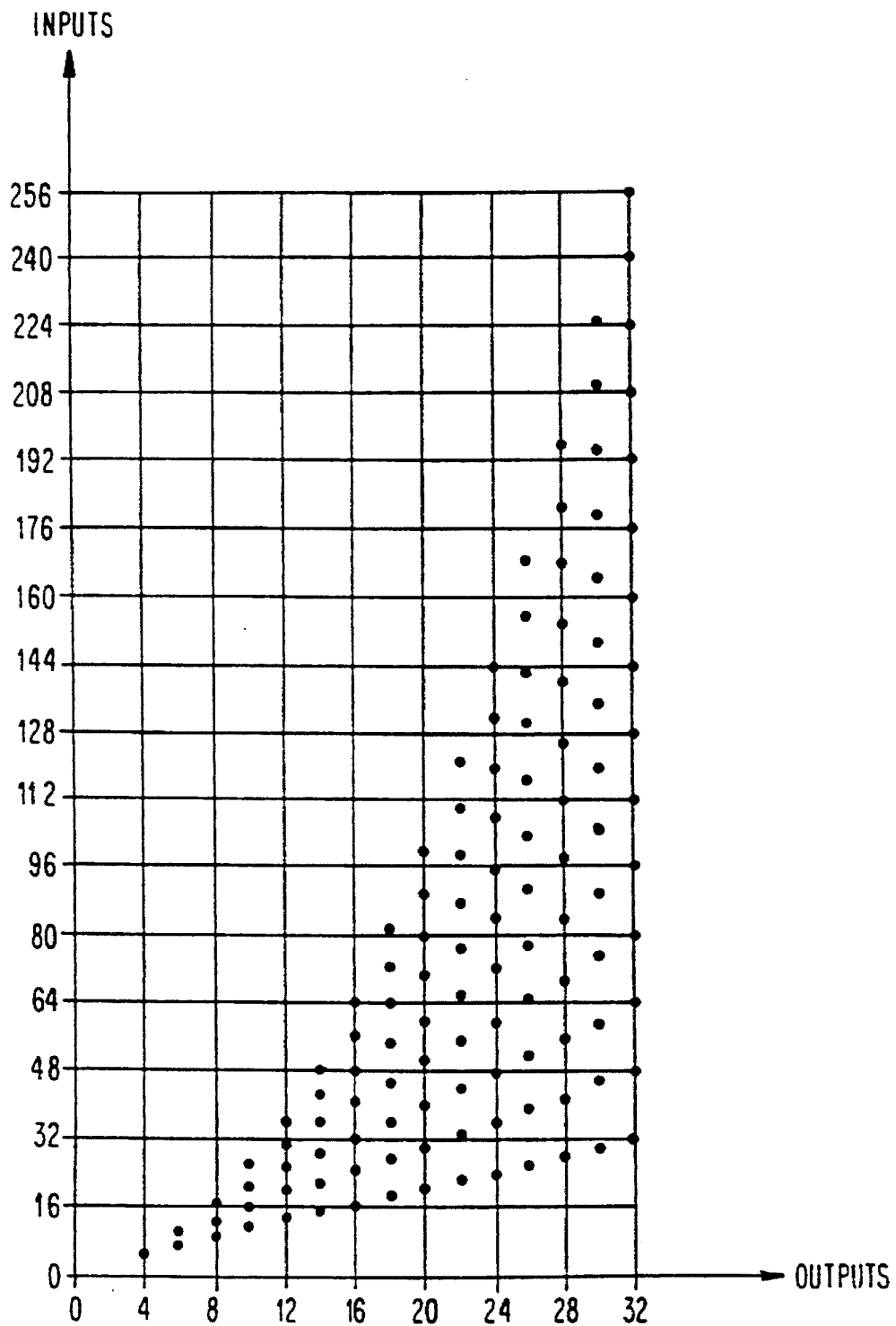
FIG. 16 is a plot showing the dimensions of illustrative sizes of communication networks that can be produced in accordance with this invention.

Generally, by ignoring k bands of a synthesized multiplexer pattern, a network with $v^2-kv$ inputs is created. The sizes of all networks that can be synthesized from cages of girth four for v=2 through v=16 with whole numbers of bands are plotted in FIG. 16. Of course networks of sizes other than those corresponding to the points plotted in FIG. 16 can be produced by deleting individual input conductors from the top or bottom of the multiplexer pattern as mentioned above.

Figure 20:
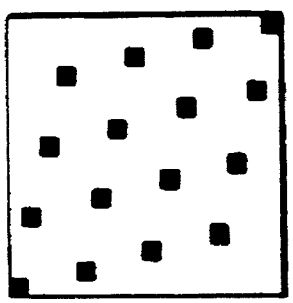
FIGS. 17–20 show several alternatives to illustrative multiplexer connection patterns in accordance with this invention.
Figure 19:
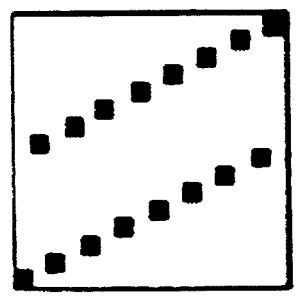
Figure 18:
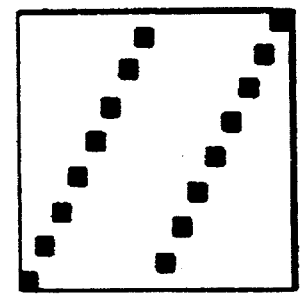
Figure 17:
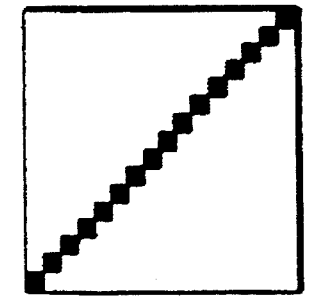

If desired, ease of manufacture of regular multiplexer patterns such as those described above may be further increased by permuting the input conductors in a regular way. Some useful permutations of the regular multiplexer pattern shown in FIG. 17 are shown in FIGS. 18, 19, and 20. In FIG. 18, for example, every second input conductor is separated from the remaining input conductors and moved down to a separate sub-group of conductors. In FIG. 19 each input conductor from the lower half of the group is moved up between a respective pair of the input conductors in the upper half of the group. In FIG. 20 the group is divided into four vertical sub-groups and the conductors are taken one after another from the sub-groups in a repeating sequence. These permutations help to spread out the multiplexer input connections in both the horizontal and vertical directions. If such permutations are employed for the multiple groups of input conductors in a network (e.g., the four groups of conductors in the network shown in FIG. 13), the same permutation rule is preferably applied to the input conductors in each group.

It will be understood that the foregoing is only illustrative of the principles of the invention, and that various modifications can be made by those skilled in the art without departing from the scope and spirit of the invention. For example, communication networks of any size can be produced using this invention as described above.

The invention claimed is:

1. A method for producing integrated circuit communication networks of the type having a plurality of substantially parallel, side by side, input conductors connected to inputs of a plurality of multiplexers in such a way that each of said input conductors is connected to the inputs of two of said multiplexers, said method comprising the steps of:

selecting a cage having girth four and a number of vertices equal to the number of multiplexers in said plurality of multiplexers, said cage having a plurality of edges;

associating each of said multiplexers with a respective one of said vertices;

identifying bands of edges in said cage;

associating each of said input conductors with a respective one of said edges in such a way that no two physically adjacent input conductors are associated with edges in different bands that have any vertices in common; and fabricating one of said integrated circuit communication networks by connecting each input conductor associated with an edge to the inputs of the multiplexers associated with vertices which that edge extends between.

2. The method defined in claim 1 wherein the cage selected in said selecting step has a number of edges greater than the number of input conductors in said plurality of input conductors, and wherein in said step of associating each of said input conductors with a respective one of said edges no input conductors are associated with any of the edges in at least one of said bands of edges.

3. An integrated circuit communication network comprising:

a plurality of substantially parallel, side by side, input conductors; and a predetermined plural number of multiplexers, each of said multiplexers having a plurality of inputs, each of said input conductors being connected to an input of two of said multiplexers, wherein said input conductors form a plurality of adjacent, mutually exclusive groups of input conductors, each group having half as many input conductors as there are multiplexers, each multiplexer having inputs that are connected to said input conductors in said groups, such that each multiplexer is connected to one input conductor in each of said groups.

4. The apparatus defined in claim 3 wherein each input conductor in a group which is adjacent to another input conductor in an adjacent group is connected to the inputs of two multiplexers which are both different from the two multiplexers having inputs connected to said another input conductor.

5. The apparatus defined in claim 3 wherein the connections between said input conductors and said inputs of said multiplexers are such that, when each multiplexer is associated with a respective one of a plurality of vertices and each input conductor is associated with a respective one of a plurality of edges each of which extends between a respective unique pair of said vertices, said vertices and said edges collectively comprise vertices and at least a plurality of bands of edges of a cage having a girth of four.

6. The apparatus defined in claim 5 wherein said edges comprise less than all bands of edges of said cage.

7. The apparatus defined in claim 5 wherein said edges comprise all bands of edges of said cage.

8. The apparatus defined in claim 5 wherein the input conductors in each of said groups are associated with the edges in a respective band of edges in said cage.

9. The apparatus defined in claim 5 wherein said vertices form two mutually exclusive sets, all vertices in each set having no direct edge connection to any other vertex in the same set, and wherein the multiplexers associated with each of said sets of vertices are grouped together side by side in said integrated circuit communication network.

* * * * *